(12) United States Patent
Tomioka et al.

(10) Patent No.: US 10,573,709 B2
(45) Date of Patent: Feb. 25, 2020

(54) DISPLAY DEVICE

(71) Applicant: Japan Display Inc., Minato-ku (JP)

(72) Inventors: Yasushi Tomioka, Tokyo (JP); Hajime Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/008,580

(22) Filed: Jun. 14, 2018

(65) Prior Publication Data

US 2018/0366534 A1    Dec. 20, 2018

(30) Foreign Application Priority Data

Jun. 19, 2017   (JP) .................................. 2017-119827

(51) Int. Cl.
*H01L 27/32* (2006.01)
*H01L 51/00* (2006.01)

(52) U.S. Cl.
CPC ...... *H01L 27/3279* (2013.01); *H01L 51/0097* (2013.01); *H01L 2251/5338* (2013.01)

(58) Field of Classification Search
CPC ............. H01L 27/3279; H01L 51/0097; H01L 2251/5338
See application file for complete search history.

(56) References Cited

U.S. PATENT DOCUMENTS

| 9,318,427 B2 | 4/2016 | Youn et al. |
| 9,600,112 B2 | 3/2017 | Zhang et al. |
| 2002/0067456 A1 | 6/2002 | Tatsumi |
| 2012/0146886 A1 | 6/2012 | Minami et al. |
| 2014/0232956 A1 | 8/2014 | Kwon et al. |

FOREIGN PATENT DOCUMENTS

| JP | 2002-131773 | 5/2002 |
| JP | 2012-128006 | 7/2012 |

*Primary Examiner* — Anthony Ho
(74) *Attorney, Agent, or Firm* — Oblon, McClelland, Maier & Neustadt, L.L.P.

(57) ABSTRACT

According to one embodiment, there is provided a display device which includes an insulating substrate having a bend area, and a wiring line located in the bend area. The bend area is bent about a bend axis extending in a first direction. The wiring line in the bend area has a first portion which extends in the first direction and a second portion which extends in a direction intersecting the first portion and is connected to the first portion. A first angle formed by the first portion and the second portion is less than 90 degrees.

13 Claims, 15 Drawing Sheets

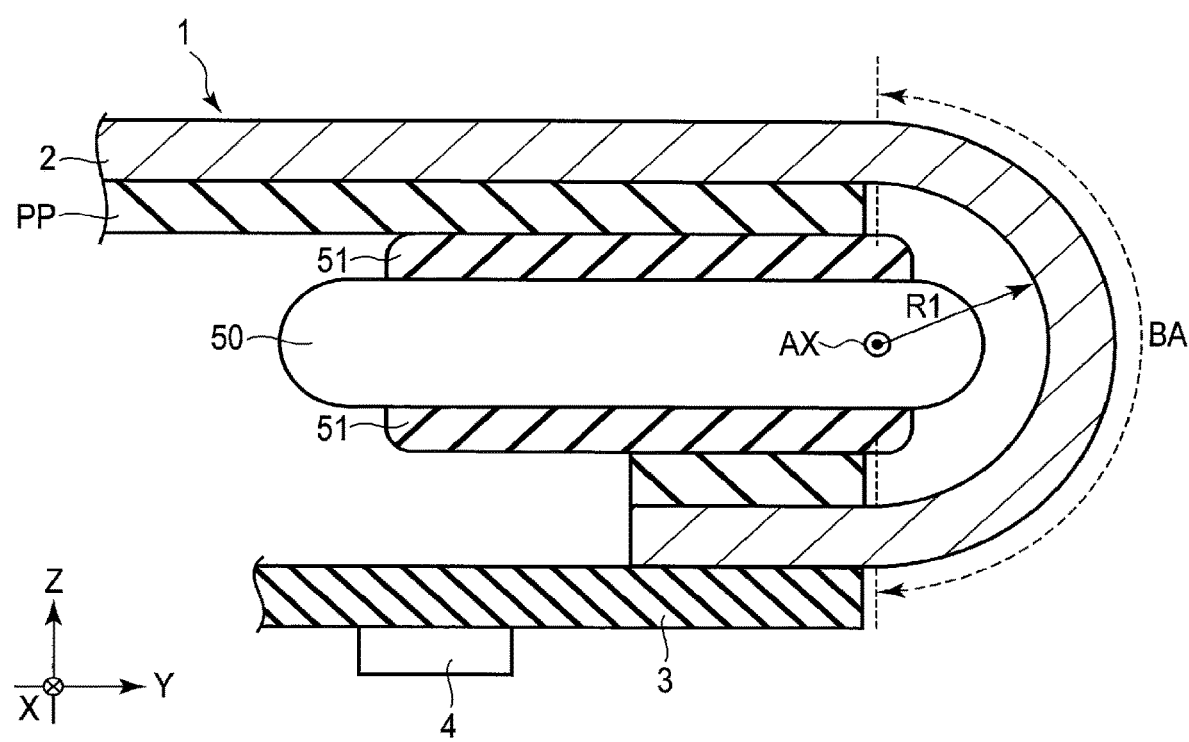
F I G. 2

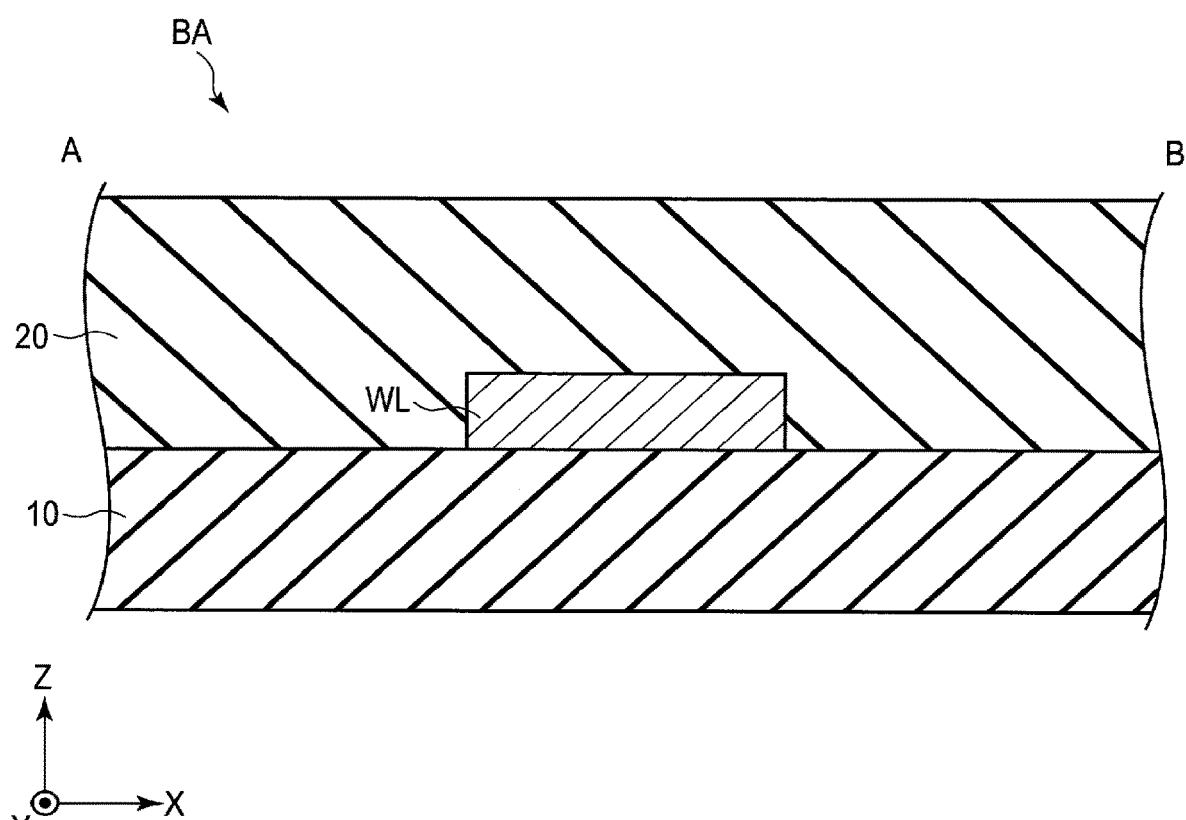
F I G. 4

DISPLAY DEVICE

CROSS-REFERENCE TO RELATED APPLICATIONS

This application is based upon and claims the benefit of priority from Japanese Patent Application No. 2017-119827, filed Jun. 19, 2017, the entire contents of which are incorporated herein by reference.

FIELD

Embodiments described herein relate generally to a display device.

BACKGROUND

In display devices used in cellular telephones, personal digital assistants (PDAs), etc., there is demand for narrow frames in light of performance, design, etc. An example of the method of narrowing a frame is a method of bending part of a display panel such that a mounting portion on which another substrate such as a wiring substrate, etc., is mounted will be located below a display surface. However, a wiring line provided in a bend area may be disconnected under the effect of stress caused by bending in some cases.

BRIEF DESCRIPTION OF THE DRAWINGS

FIG. 2 is a view showing a state where a bend area BA shown in FIG. 1 is bent.

FIG. 4 is a sectional view taken along line A-B shown in FIG. 3.

DETAILED DESCRIPTION

Figure 1:
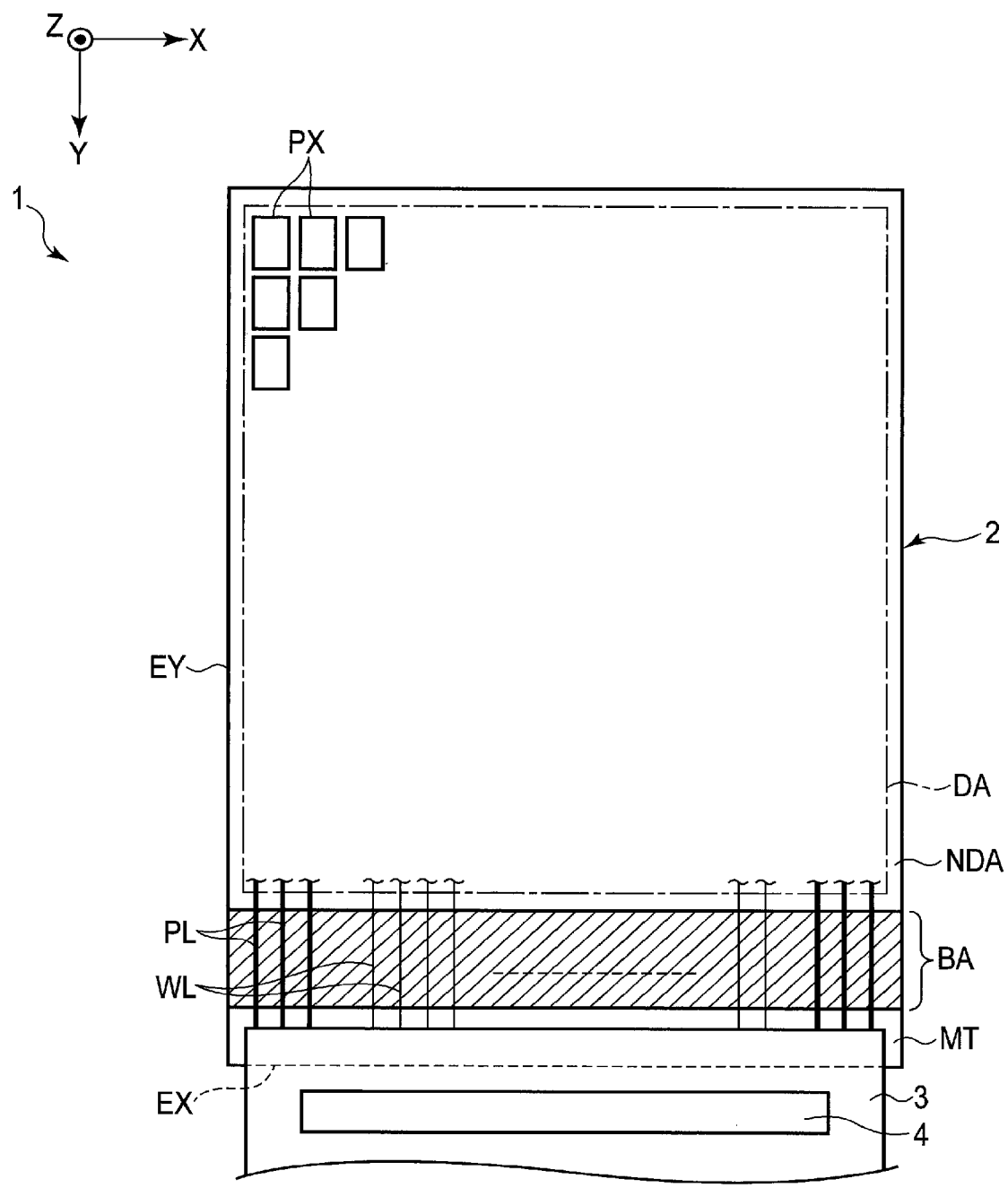
FIG. 1 is a plan view showing an example of the structure of a display device 1 according to the present embodiment.

In general, according to one embodiment, there is provided a display device which includes an insulating substrate having a bend area, and a wiring line located in the bend area. The bend area is bent about a bend axis extending in a first direction. The wiring line in the bend area has a first portion which extends in the first direction and a second portion which extends in a direction intersecting the first portion and is connected to the first portion. A first angle formed by the first portion and the second portion is less than 90 degrees.

According to another embodiment, there is provided a display device which includes an insulating substrate having a bend area, a wiring line located in the bend area, and a first inorganic insulating layer located between the wiring line and the insulating substrate. The bend area is bent about a bend axis extending in a first direction. The wiring line has a first bend portion which is bent at a first bend angle in the bend area. The first inorganic insulating layer has a second bend portion which overlaps the first bend portion and is bent at a second bend angle. The first bend angle and the second bend angle are less than 180 degrees. The second bend angle is less than the first bend angle.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

FIG. 1 is a plan view showing the structure of a display device 1 according to the present embodiment. In the present embodiment, the display device 1 is an organic electroluminescent (EL) display device having an organic EL element, for example. However, the display device 1 may be another display device such as a liquid crystal display device having a liquid crystal layer or an electronic paper-type display device having an electrophoretic element, etc.

FIG. 1 shows a three-dimensional space defined by a first direction X, a second direction Y perpendicular to the first direction X, and a third direction Z perpendicular to the first direction X and the second direction Y. The first direction X and the second direction Y may intersect each other at an angle other than 90 degrees. Further, the third direction Z is defined as above and the opposite direction to the third direction Z is defined as below in the present embodiment. Such expressions as "a second member above a first member" and "a second member below a first member" mean that the second member may be in contact with the first member or may be away from the first member. In the latter case, a third member may be interposed between the first member and the second member.

The display device 1 includes a display panel 2, a wiring substrate 3, etc.

The display panel 2 has the shape of a rectangle, for example. In the example illustrated, short sides EX of the display panel 2 are parallel to the first direction X, and long sides EY of the display panel 2 are parallel to the second direction Y. The third direction Z corresponds to the thickness direction of the display panel 2. The main surfaces of the display panel 2 are parallel to an X-Y plane defined by the first direction X and the second direction Y.

The display panel 2 has a display area DA, a non-display area NDA and a mounting portion MT. The display area DA is an area which displays an image and includes a plurality of pixels PX arranged in a matrix, for example. The pixel PX includes an organic EL element which will be described later, a switching element which drives the organic EL element, etc. The non-display area NDA is located outside the display area DA and surrounds the display area DA.

The mounting portion MT is provided along one short side EX of the display panel 2 and includes a terminal which electrically connects the display panel 2 to an external device, etc.

The wiring substrate 3 is mounted on the mounting portion MT and is electrically connected to the display panel 2. The wiring substrate 3 is a flexible printed circuit, for example. The wiring substrate 3 includes a driver IC chip 4 which drives the display panel 2. The length of the side edges of the wiring substrate 3 which are parallel to the first direction X is less than the length of the short sides EX in the example illustrated but may be equal to the length of the short sides EX.

The display panel 2 is flexible in the present embodiment. That is, the display panel 2 has a bend area BA as shown by diagonal lines. The bend area BA is an area which is bent when the display device 1 is accommodated in the housing of an electronic device, etc. The bend area BA is located on the mounting portion MT side in the non-display area NDA. In the example illustrated, wiring lines WL and power supply lines PL are provided in the bend area BA. The wiring lines WL and the power supply lines PL extend from the display area DA to the mounting portion MT and are electrically connected to the wiring substrate 3. For example, the power supply lines PL are located on both ends beside the long sides EY, and the wiring lines WL are located between the power supply lines PL.

FIG. 2 is a view showing a state where the bend area BA shown in FIG. 1 is bent. FIG. 2 shows a plane parallel to a Y-Z plane. Here, only a structure necessary for explanation is shown in the drawing.

The display device 1 includes a protective member PP and a support member 50 in addition to the display panel 2 and the wiring substrate 3.

The protective member PP is provided on the opposite surface to the display surface of the display panel 2 except the bend area BA. The protective member PP functions, for example, as a support layer which prevents the display panel 2 from bending in the display area DA. Further, the protective member PP has the moisture-proof property of preventing the entry of moisture, etc., to the display panel 2 and the gas barrier property of preventing the entry of gas to the display panel 2, and functions as a barrier layer. The protective member PP is a film formed of polyethylene terephthalate, for example. Note that another thin film may be interposed between the protective member PP and the display panel 2.

The display panel 2 is bent such that the support member 50 is sandwiched by the display panel 2, and is attached to the support member 50 by an adhesive 51. In the example illustrated, the protective member PP and the adhesive 51 contact each other. The wiring substrate 3 is located below the display panel 2, and is opposed substantially parallel to the display panel 2 and the support member 50. Note that the support member 50 may be omitted.

In the present embodiment, the bend area BA is bent about a bend axes AX which extends in the first direction X. The bend area BA is curved. Here, the bend axes AX is parallel to the generatrix of the curved surface formed by the bend area BA. That is, the generatrix of the bend area BA is parallel to the first direction X. In the example illustrated, the bend area BA is curved along the circumference of a circle. A radius of curvature R1 of the bend area BA is defined as, for example, the distance from the bend axis AX to the inner surface of the display panel 2. For example, the radius of curvature R1 is 0.3 mm.

Figure 3:
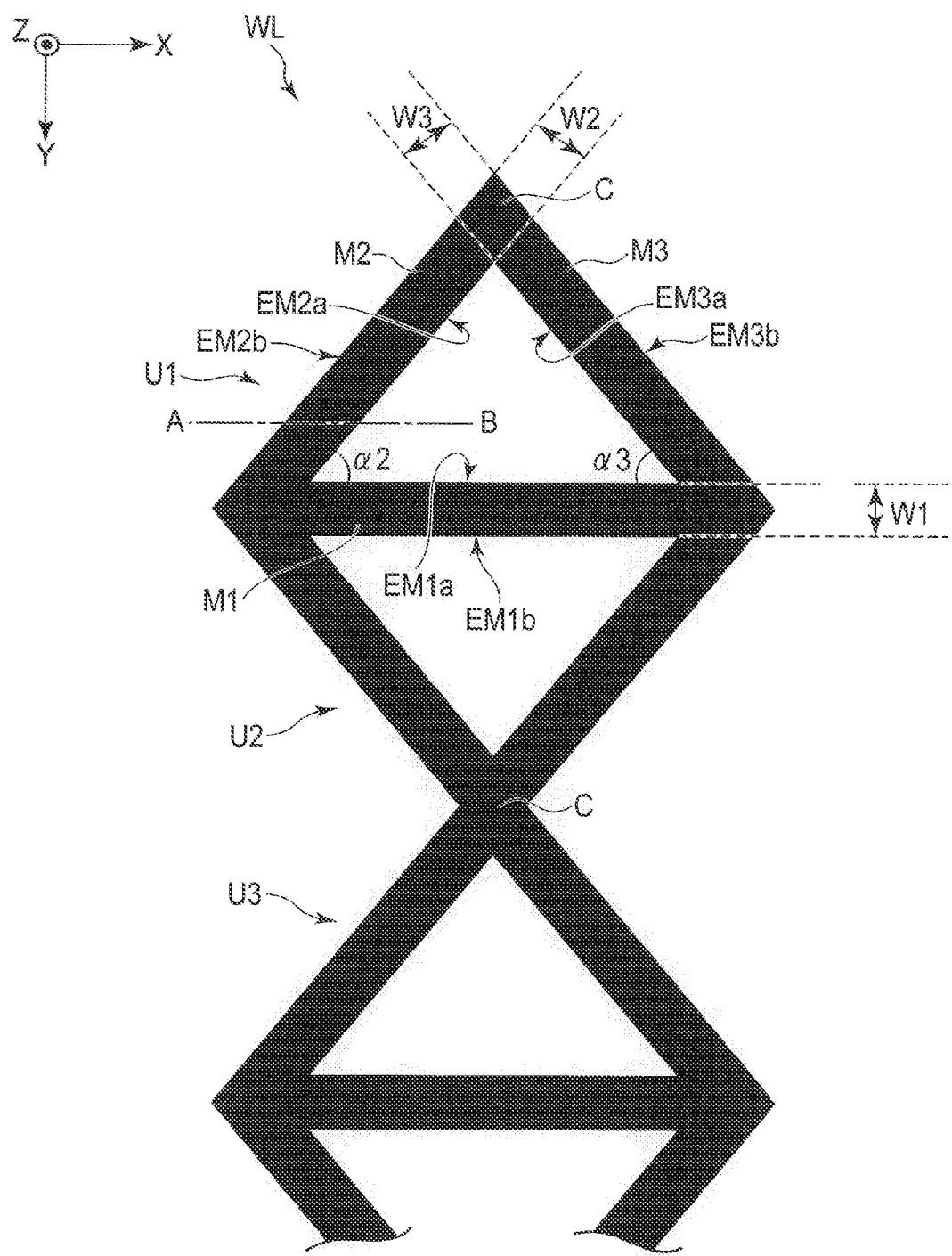
FIG. 3 is a plan view showing an example of the structure of a wiring line WL in the bend area BA.

FIG. 3 is a plan view showing an example of the structure of the wiring line WL in the bend area BA. FIG. 3 shows a plane parallel to the X-Y plane. Here, the first direction X corresponds to the direction of the bend axis, and the second direction Y corresponds to the direction of bending.

The wiring line WL is composed of a plurality of units U (U1, U2, U3 . . . ) arranged in the second direction Y. As an example of the structure of the units U, the structure of the unit U1 will be described below. For example, the unit U1 is substantially a triangle and has portions M1, M2 and M3. The portions M1, M2 and M3 are formed of a single member in the example illustrated but may be formed of a plurality of members.

The portion M1 has the shape of a strip having a substantially constant width W1 and extends in the first direction X. That is, the portion M1 orthogonally crosses the bend direction. The portion M1 has linear edges EM1a and EM1b. The edge EM1a is opposed to portions M2 and M3. The edge EM1b is located on the opposite side to the edge EM1a and extends substantially parallel to the edge EM1a. The width W1 corresponds to the distance between the edge EM1a and the edge EM1b in the second direction Y.

The portion M2 has the shape of a strip having a substantially constant width W2 and extends in a direction intersecting the first direction X and the second direction Y. Here, the width W2 is defined by the direction orthogonal to the extension direction of the portion M2. In the example illustrated, the portion M2 extends from one end of the portion M1 and is inclined at an angle α2 with respect to the portion M1. The angle α2 is one of angles formed by the first direction X and the portion M2 which is less than 90 degrees.

The portion M2 has linear edges EM2a and EM2b. The edge EM2a is opposed to the portions M1 and M3. The edge EM2b is located on the opposite side to the edge EM2a and extends substantially parallel to the edge EM2a. In the example illustrated, the angle α2 corresponds to an angle formed by the edge EM1a and the edge EM2a. The edge EM1a and the edge EM2a linearly intersect each other in the example illustrated but generally have a curvature R.

The portion M3 is arranged with the portion M2 in the first direction X. The portion M3 has the shape of a strip having a substantially constant width W3 and extends in a direction intersecting the first direction X and the second direction Y. Here, the width W3 is defined by the direction orthogonal to the extension direction of the portion M3. In the example illustrated, the portion M3 extends from the other end of the portion M1 to the portion M2 and is connected to the portion M2. The portion M3 is inclined at an angle α3 with respect to the portion M1. Here, the angle α3 is one of angles formed by the first direction X and the portion M3 which is less than 90 degrees.

The portion M3 has linear edges EM3a and EM3b. The edge EM3a is opposed to the portions M1 and M2. The edge EM3b is located on the opposite side to the edge EM3a and extends substantially parallel to the edge EM3a. In the example illustrated, the angle α3 corresponds to an angle formed by the edge EM1a and the edge EM3a. The edge EM1*a* and the edge EM3*a* linearly intersect each other in the example illustrated but may intersect each other at the curvature R.

In the present embodiment, the angles α2 and α3 should preferably be greater than or equal to 30 degrees and less than or equal to 70 degrees, more desirably, greater than or equal to 45 degrees and less than or equal to 60 degrees. In the example illustrated, the unit U1 is substantially an isosceles triangle in which the angle α2 and the angle α3 are equal to each other. However, the angle α2 and the angle α3 may differ from each other. Further, the widths W1, W2 and W3 are equal to each other in the example illustrated, but the widths W1, W2 and W3 may differ from each other as will be described later.

The units U which are adjacent to each other in the second direction Y are arranged inversely in the second direction Y. For example, the portion M1 is shared between the unit U1 and the unit U2. An intersection C of the portion M2 and the portion M3 is shared between the unit U2 and the unit U3.

FIG. 4 is a sectional view taken along line A-B shown in FIG. 3. FIG. 4 shows a plane parallel to an X-Z plane.

The wiring line WL is formed on an insulating substrate 10 in the bend area BA. The insulating substrate 10 is formed of an organic insulating material such as polyimide, for example. The wiring line WL is formed of a metal material such as molybdenum, tungsten, titanium or aluminum and may have a single layer structure or a multilayer structure. In the example illustrated, the wiring line WL is covered with a resin layer 20. The resin layer 20 contacts the wiring line WL and also contacts the insulating substrate 10 on both sides of the wiring line WL. The wiring line WL contacts the insulating substrate 10, but another insulating layer may be interposed between the wiring line WL and the insulating substrate 10 as will be described layer.

According to the present embodiment, the wiring line WL is composed of the units U arranged in the second direction Y. The unit U includes the portions M2 and M3 extending in directions which are inclined with respect to the bend direction (second direction Y). Since the extension directions of the portions M2 and M3 are inclined with respect to the second direction Y, when the bend area BA is bent, stress applied to the portions M2 and M3 can be reduced, and disconnection of the wiring line WL can be prevented.

Further, the portion M2 and the portion M3 are connected by the portion M1. As a result, the portion M2 and the portion M3 are electrically connected to each other and the substantive thickness of the wiring line WL is increased, and consequently, the resistance of the wiring line WL can be reduced. Still further, since the portion M1 is orthogonal to the bend direction, hardly any load is applied to the portion M1 when the bend area BA is bent. As described above, according to the present embodiment, the disconnection of wiring lines caused by bending can be prevented and the resistance of wiring lines can be reduced.

Figure 5:
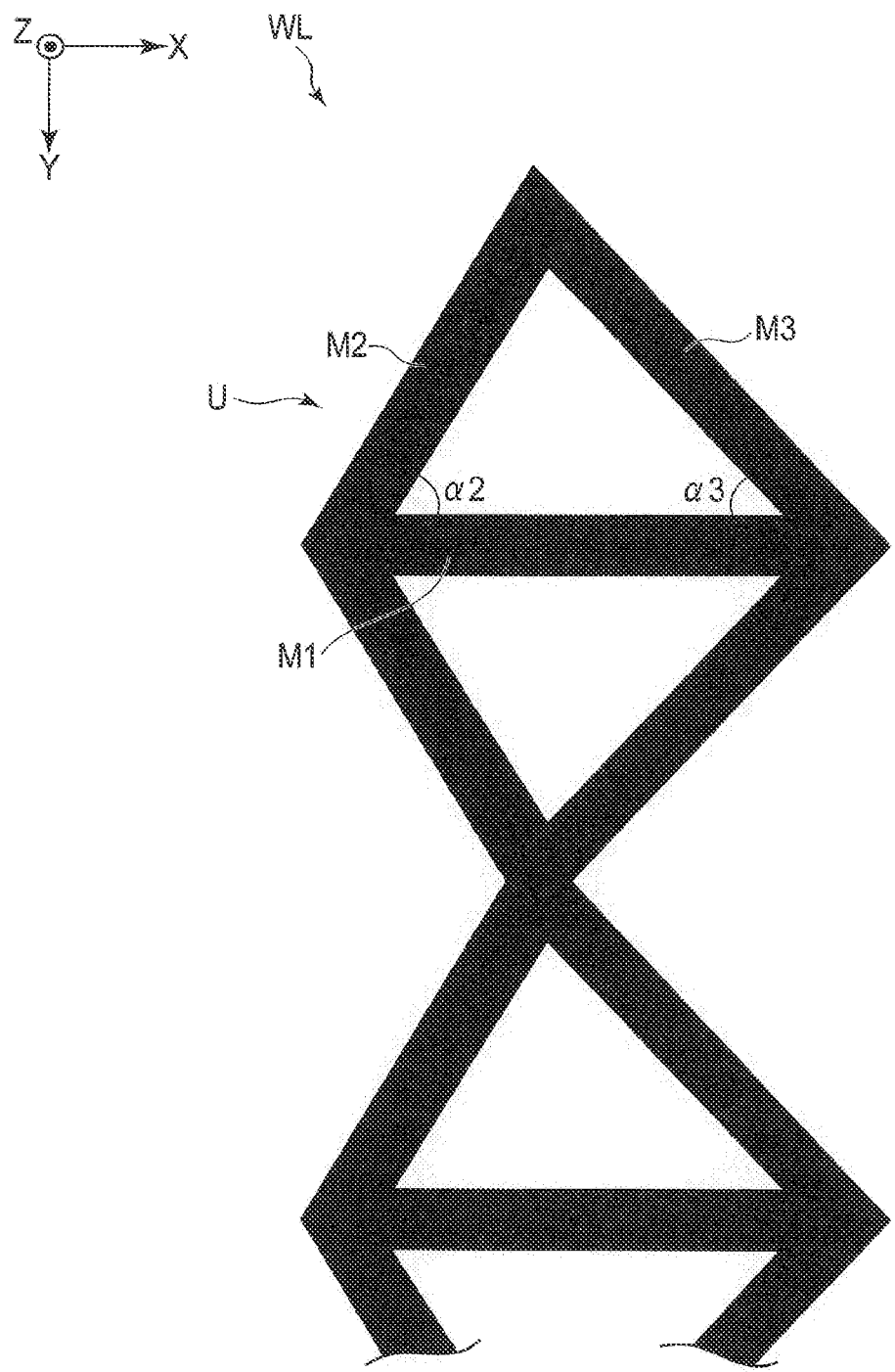
FIG. 5 is a plan view of another example of the structure of the wiring line WL.

FIG. 5 is a plan view of another example of the structure of the wiring line WL. The structural example shown in FIG. 5 differs from the structural example shown in FIG. 3 in that the angle α2 and the angle α3 differ from each other. The angle α2 is greater than the angle α3 in the example illustrated. The same effect as that produced from the structural example shown in FIG. 3 can be produced from the present structural example.

Figure 6:
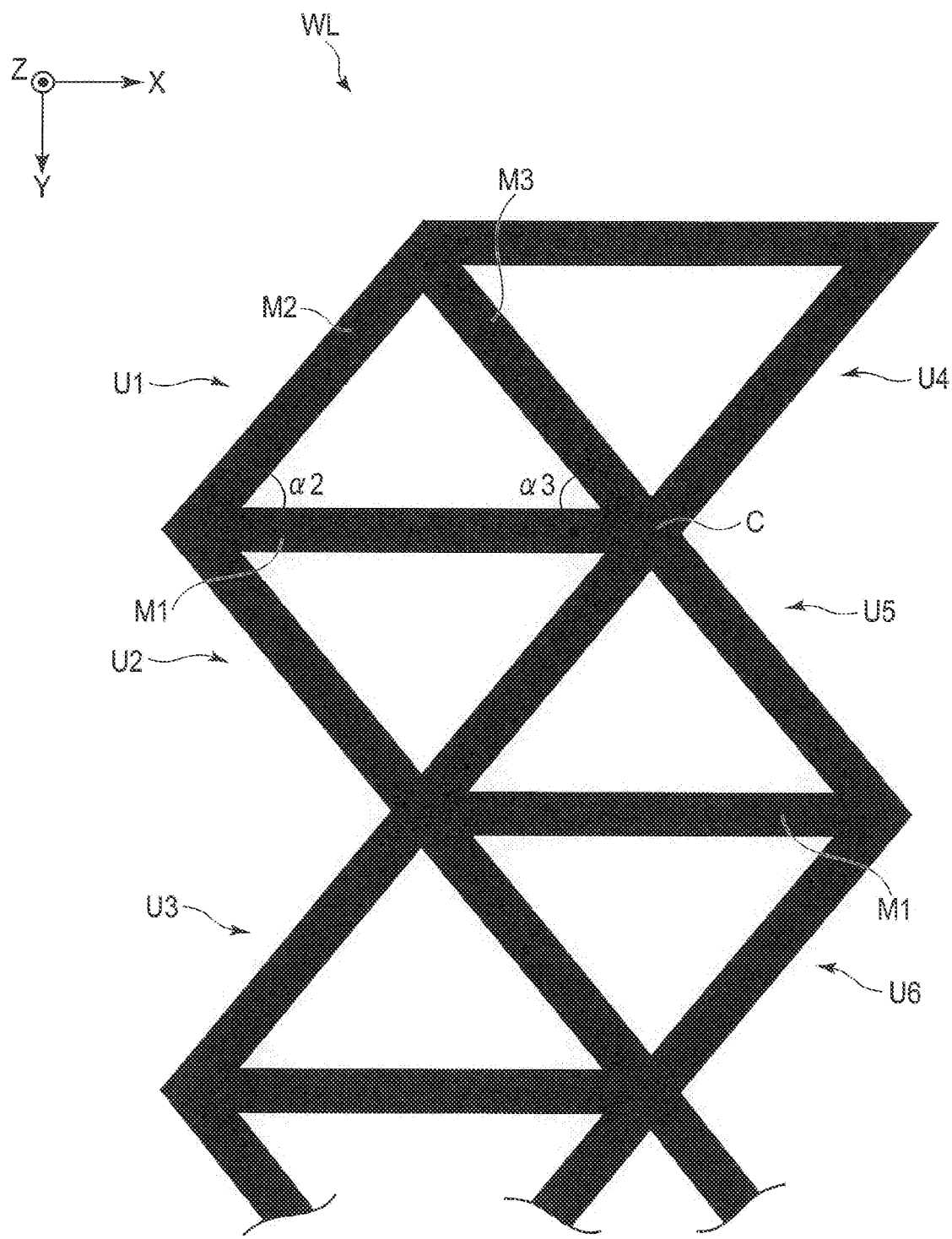
FIG. 6 is a plan view of another example of the structure of the wiring line WL.

FIG. 6 is a plan view of another example of the structure of the wiring line WL. The structural example shown in FIG. 6 differs from the structural example shown in FIG. 3 in that the units U are arranged in the first direction X.

That is, the wiring line WL has units U4, U5 and U6 which are adjacent to the units U1, U2 and U3, respectively, in the first direction X. The intersection C is shared between the unit U4 and the unit U5. The portion M1 is shared between the unit U5 and the unit U6. Further, the portion M3 is shared between the unit U1 and the unit U4.

The same effect as that produced from the structural example shown in FIG. 3 can be produced from the present structural example. Further, the resistance of the wiring line WL can be further reduced by increasing the substantive thickness of the wiring line WL. The present structural example is suitable for the power supply line PL, etc., through which a relatively large current passes.

Figure 7:
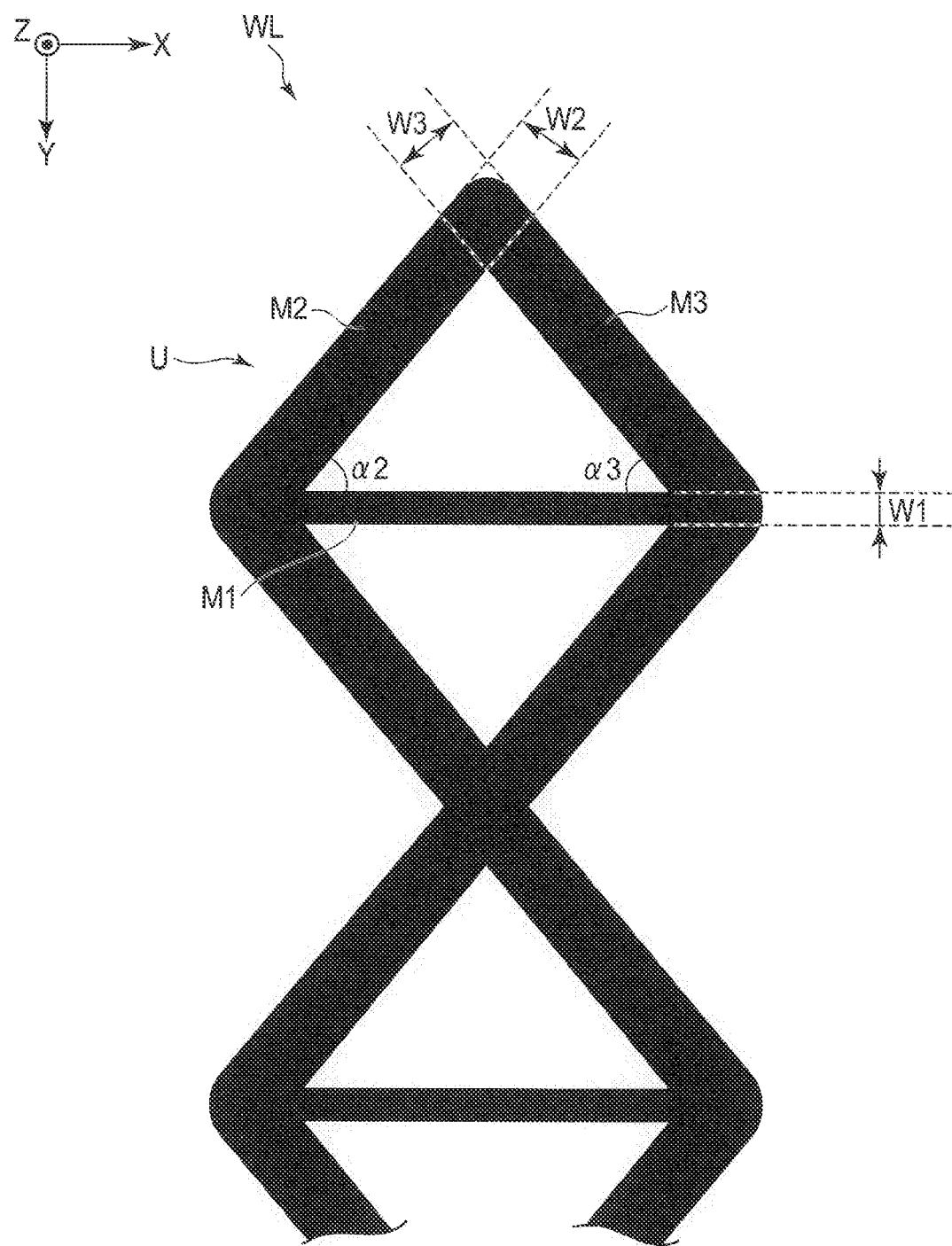
FIG. 7 is a plan view of another example of the structure of the wiring line WL.

FIG. 7 is a plan view of another example of the structure of the wiring line WL. The structural example shown in FIG. 7 differs from the structural example shown in FIG. 3 in that the widths W2 and W3 differ from the width W1. In the example illustrated, the width W2 and the width W3 are equal to each other and are greater than the width W1.

The same effect as that produced from the structural example shown in FIG. 3 can be produced from the present structural example. Further, according to the present embodiment, the width W1 is less than the widths W2 and W3. In general, wiring lines extending parallel to the bend direction are subjected to high bending stress, and wiring lines extending orthogonally to the bend direction are subjected to low bending stress. Therefore, if the wiring lines WL have the same resistance, for example, the wiring line WL in which the width W1 is less than the widths W2 and W3 as is the case with the present structural example has higher bending resistance than the wiring line WL in which the width W1 is greater than the widths W2 and W3.

Figure 8:
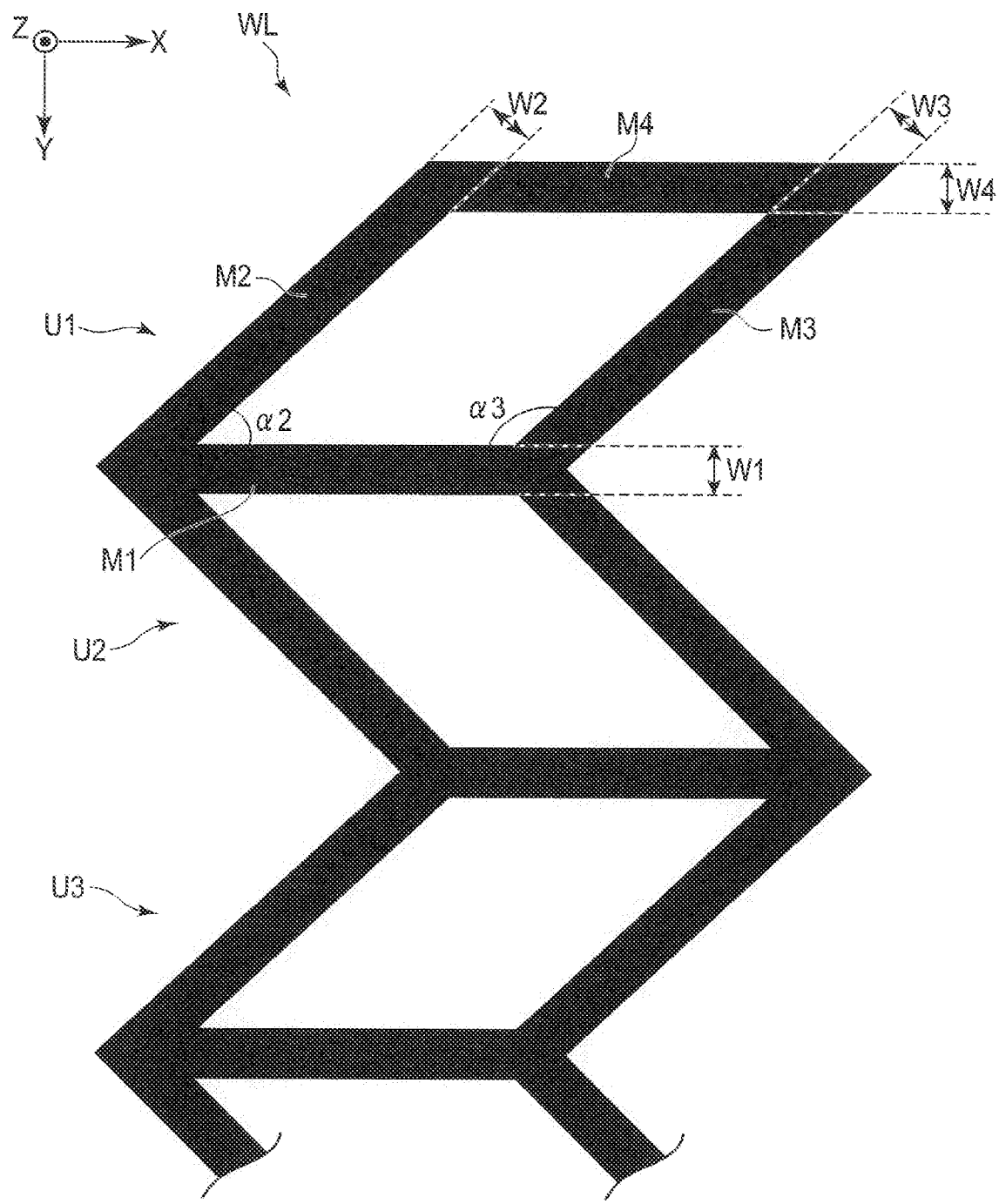
FIG. 8 is a plan view of another example of the structure of the wiring line WL.

FIG. 8 is a plan view of another example of the structure of the wiring line WL. The structural example shown in FIG. 8 differs from the structural example shown in FIG. 3 in that the unit U is substantially a parallelogram.

That is, the unit U has a portion M4 in addition to the portions M1, M2 and M3. The portion M3 extends parallel to the portion M2. The portion M4 extends parallel to the portion M1, that is, the first direction X and connects the portion M2 and the portion M3. In the present structural example, the angle α3 is an obtuse angle. Here, the angle α3 and the angle α2 have such a relationship as α3=180−α2.

In the example illustrated, the widths W1, W2, W3 and W4 of the portions M1, M2, M3 and M4 are equal to each other. Note that the widths W1, W2, W3 and W4 may differ from each other as will be described later.

The same effect as that produced from the structural example shown in FIG. 3 can be produced from the present structural example. Further, since the substantive thickness of the wiring line WL is increased, the resistance of the wiring line WL can be further reduced.

Figure 9:
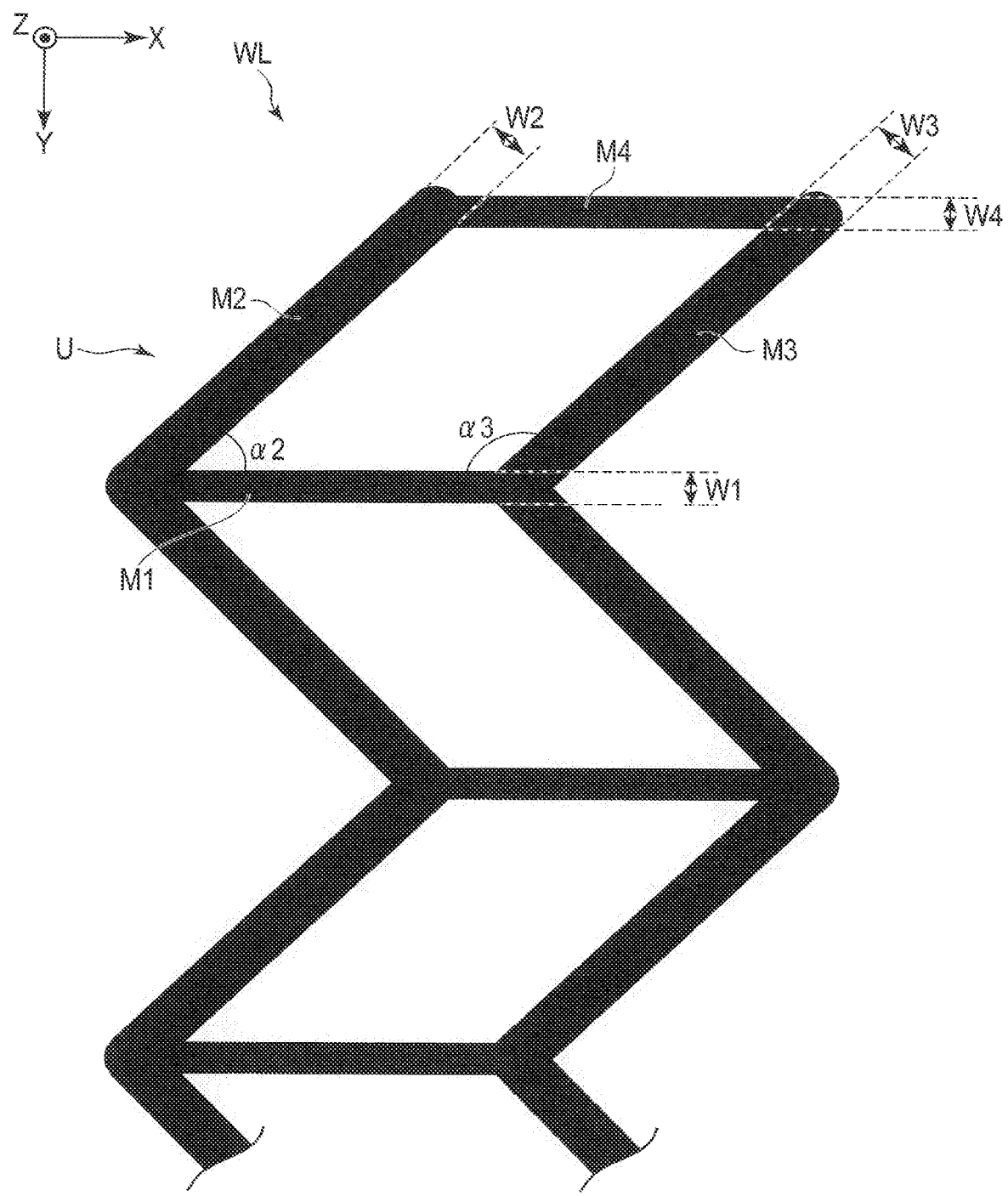
FIG. 9 is a plan view of another example of the structure of the wiring line WL.

FIG. 9 is a plan view of another example of the structure of the wiring line WL. The structural example shown in FIG. 9 differs from the structural example shown in FIG. 8 in that the widths W1 and W4 differ from the widths W2 and W3.

For example, the widths W1 and W4 are less than the widths W2 and W3. The widths W1 and W4 are equal to each other in the example illustrated but may differ from each other. Further, the widths W2 and W3 are equal to each other in the example illustrated but may differ from each other.

The same effect as that produced from the structural example shown in FIG. 8 can be produced from the present structural example. Further, since the widths W1 and W4 are less than the widths W2 and W3, as compared to a case where the widths W1 and W4 are greater than the widths W2 and W3, the bending resistance can be increased.

Figure 10:
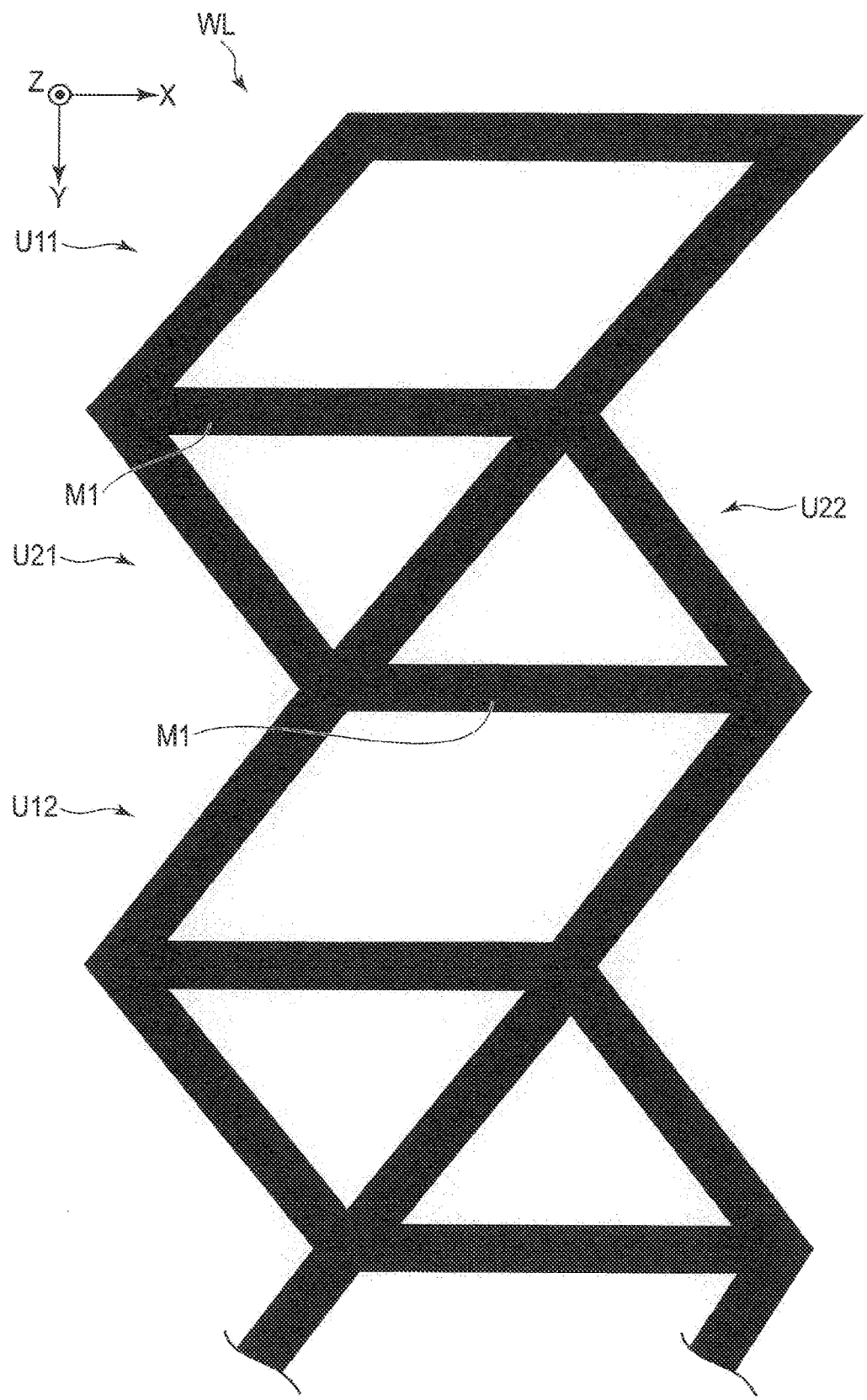
FIG. 10 is a plan view of another example of the structure of the wiring line WL.

FIG. 10 is a plan view of another example of the structure of the wiring line WL. The structural example shown in FIG. 10 differs from the structural example shown in FIG. 3 in that the wiring line WL includes two types of units, that is, units U1 (U11, U12, ... ) and units U2 (U21, U22, ... ).

For example, the unit U1 is substantially a parallelogram, and the unit U2 is substantially a triangle. The unit U1 and the unit U2 are alternately arranged in the second direction Y. The units U21 and U22 are arranged in the first direction X between the unit U11 and the unit U12. The portions M1 are shared between the unit U11 and the unit 21 and between the unit U22 and the unit 12, respectively. Further, one side of the triangle is shared between the unit U21 and the unit U22.

The same effect as that produced from the structural example shown in FIG. 3 can be produced from the present structural example. Further, since the substantive thickness of the wiring line WL is increased, the resistance of the wiring line WL can be further reduced.

Figure 11:
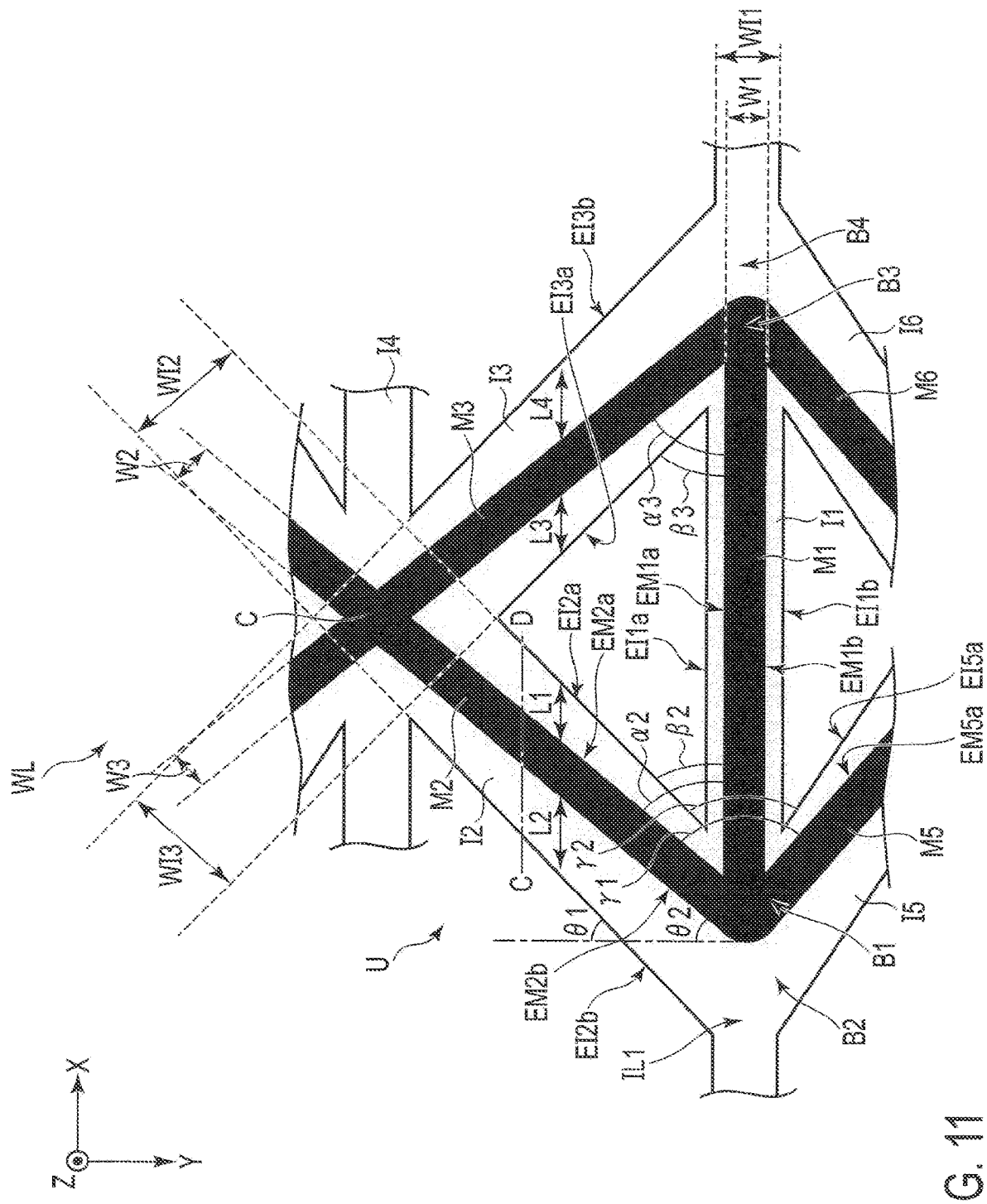
FIG. 11 is a plan view of another example of the structure of the wiring line WL.

FIG. 11 is a plan view of another example of the structure of the wiring line WL. The structural example shown in FIG. 11 differs from the structural example shown in FIG. 3 in that an inorganic insulating layer IL1 is provided in the bend area BA.

The inorganic insulating layer IL1 is located directly below the wiring line WL and has substantially the same shape as that of the wiring line WL. The wiring line WL entirely overlaps the inorganic insulating layer IL1. The inorganic insulating layer IL1 has a portion I1 overlapping the portion M1, a portion I2 overlapping the portion M2 and a portion I3 overlapping the portion M3. In the example illustrated, the inorganic insulating layer IL1 has a portion I4 which overlaps the intersection C and extends in the first direction X. That is, the portion I4 is also formed in an area in which the wiring line WL is not provided. As the portion I4 is arranged, stress on the inorganic insulating layer IL1 which concentrates into bend portions of the wiring line WL at the time of bending can be distributed. Further, the contact area of the inorganic insulating layer IL1 and the resin layer provided on the wiring line WL increases, and the degree of contact increases, accordingly. Note that the portion I4 may be omitted.

The portions I1, I2 and I3 are formed into strips having substantially constant widths WI1, WI2 and WI3. Here, the widths are defined by the directions orthogonal to the extension directions of the portions I1, I2 and I3. The width WI1 is greater than the width W1, the width WI2 is greater than the width W2, and the width WI3 is greater than the width W3. The width WI1 is less than the widths WI2 and WI3 in the example illustrated but may be equal to each other.

The portion I1 extends in the first direction X. In the example illustrated, the portion M1 is located substantially at the center of the portion I1 in the second direction Y. The portion I1 has linear edges EI1$a$ and EI1$b$. The edge EI1$a$ is opposed to the portions I2 and I3. The edge EI1$b$ is located on the opposite side to the edge EI1$a$ and extends substantially parallel to the edge EI1$a$. In the example illustrated, the portion I1 also extends in an area in which the portion M1 is not formed.

The portion I2 extends from one end side of the portion M1 to the intersection C. The portion I2 has linear edges EI2$a$ and EI2$b$. The edge EI2$a$ is opposed to the portions I1 and I3. The edge EI2$b$ is located on the opposite side to the edge EI2$a$ and extends substantially parallel to the edge EI2$a$. The portion I2 is inclined at an angle $\beta 2$ with respect to the portion M1. The angle $\theta 2$ is one of angles formed by the first direction X and the portion I2 which is less than 90 degrees. In the example illustrated, the angle $\beta 2$ corresponds to an angle formed by the edge EM1$a$ and the edge EI2$a$.

In the present embodiment, the angle $\beta 2$ and the angle $\alpha 2$ differ from each other. For example, the angle $\beta 2$ is less than the angle $\alpha 2$. In other words, the portion I2 is more inclined with respect to the bend direction than the portion M2. That is, an inclination angle $\theta 1$ formed by the bend direction and the portion I2 is greater than an inclination angle $\theta 2$ formed by the bend direction and the portion M2. Here, the inclination angle $\theta 1$ corresponds to an angle formed by the second direction Y and the edge EI2$b$, and the inclination angle $\theta 2$ corresponds to an angle formed by the second direction Y and the edge EM2$b$.

Since the angle $\beta 2$ is less than the angle $\alpha 2$, a distance L1 between the edge EI2$a$ and the portion M2 and a distance L2 between the edge EI2$b$ and the portion M2 vary in the second direction Y. The distance L1 on the intersection C side (that is, the display area DA side) is greater than the distance L1 on the portion M1 side (that is, the side which is away from the display area DA). On the other hand, the distance L2 on the intersection C side is less than the distance L2 on the portion M1 side.

The portion I3 extends from the other end side of the portion M1 to the intersection C and is connected to the portion I2. The portion I3 is inclined at an angle $\beta 3$ with respect to the portion M1. The angle $\beta 3$ is one of angles formed by the first direction X and the portion I3 which is less than 90 degrees. The portion I3 has linear edges EI3$a$ and EI3$b$. The edge EI3$a$ is opposed to the portions I1 and I2. The edge EI3$b$ is located on the opposite side to the edge EI3$a$ and extends substantially parallel to the edge EI3$a$. In the example illustrated, the angle $\beta 3$ corresponds to an angle formed by the edge EM1$a$ and the edge EI3$a$.

Similarly to the relationship between the portion I2 and the portion M2, the portion I3 is more inclined with respect to the bend direction than the portion M3. That is, the angle $\beta 3$ is less than the angle $\alpha 3$. Therefore, a distance L3 between the edge EI3$a$ and the portion M3 and a distance L4 between the edge EI3$b$ and the portion M3 vary in the second direction Y. The distance L3 on the intersection C side is greater than the distance L3 on the portion M1 side. On the other hand, the distance L4 on the intersection C side is less than the distance L4 on the portion M1 side.

Further, the relationship between the wiring line WL and the inorganic insulating layer IL1 can also be explained as follows with reference to a bend portion B1 provided in the wiring line WL and a bend portion B2 provided in the inorganic insulating layer IL1.

The bend portion B1 includes the portion M2 and a portion M5 and is bent at a bend angle $\gamma 1$. The portion M5 extends from one end of the portion M1 to the side opposite to the portion M2. In other words, the portion M1 is sandwiched between the portion M2 and the portion M5. The bend angle $\gamma 1$ is one of angles formed by the portion M2 and the portion M5 which is less than 180 degrees. In the example illustrated, the bend angle $\gamma 1$ corresponds to an angle formed by the edge EM2$a$ and an edge EM5$a$ of the portion M5 which is opposed to the portion M1. The angle formed by the portion M5 and the portion M1 is equal to the angle $\alpha 2$, for example, but may differ from the angle $\alpha 2$.

The bend portion B2 includes the portion I2 and a portion I5 and is bent at a bend angle $\gamma 2$. The portion I5 extends from one end side of the portion M1 to the side opposite to the portion I2. In other words, the portions M1 and I1 are sandwiched between the portion I2 and the portion I5. The bend angle γ2 is one of angles formed by the portion I2 and the portion I5 which is less than 180 degrees. In the example illustrated, the bend angle γ2 corresponds to an angle formed by the edge EI2a and an edge EI5a of the portion I5 which is opposed to the portion M1. The angle formed by the portion I5 and the portion M1 is equal to the angle β2, for example, but may differ from the angle β2.

In the present embodiment, the bend angle γ2 is less than the bend angle γ1. In the example illustrated, the edge EI2a is closer to the portion M1 than the edge EM2a, and the edge EI5a is closer to the portion M1 than the edge EM5a.

Further, the wiring line WL has a bend portion B3 which is arranged with the bend portion B1 in the first direction X. The bend portion B3 includes the portion M3 and a portion M6. The portion M6 extends from the other end of the portion M1 to the side opposite to the portion M3. The portion M1 can be regarded as a connecting portion which connects the bend portion B1 and the bend portion B3. Similarly, the inorganic insulating layer IL1 has a bend portion B4 which is arranged with the bend portion B2 in the first direction X. The bend portion B4 includes the portion I3 and a portion I6. The portion I6 extends from the other end side of the portion M1 to the side opposite to the portion I3. The portion I1 can be regarded as a connecting portion which connects the bend portion B2 and the bend portion B4. In the example illustrated, the bend portion B1 and the bend portion B2 project in the direction opposite to the first direction X, and the bend portion B3 and the bend portion B4 project in the first direction X.

Figure 12:
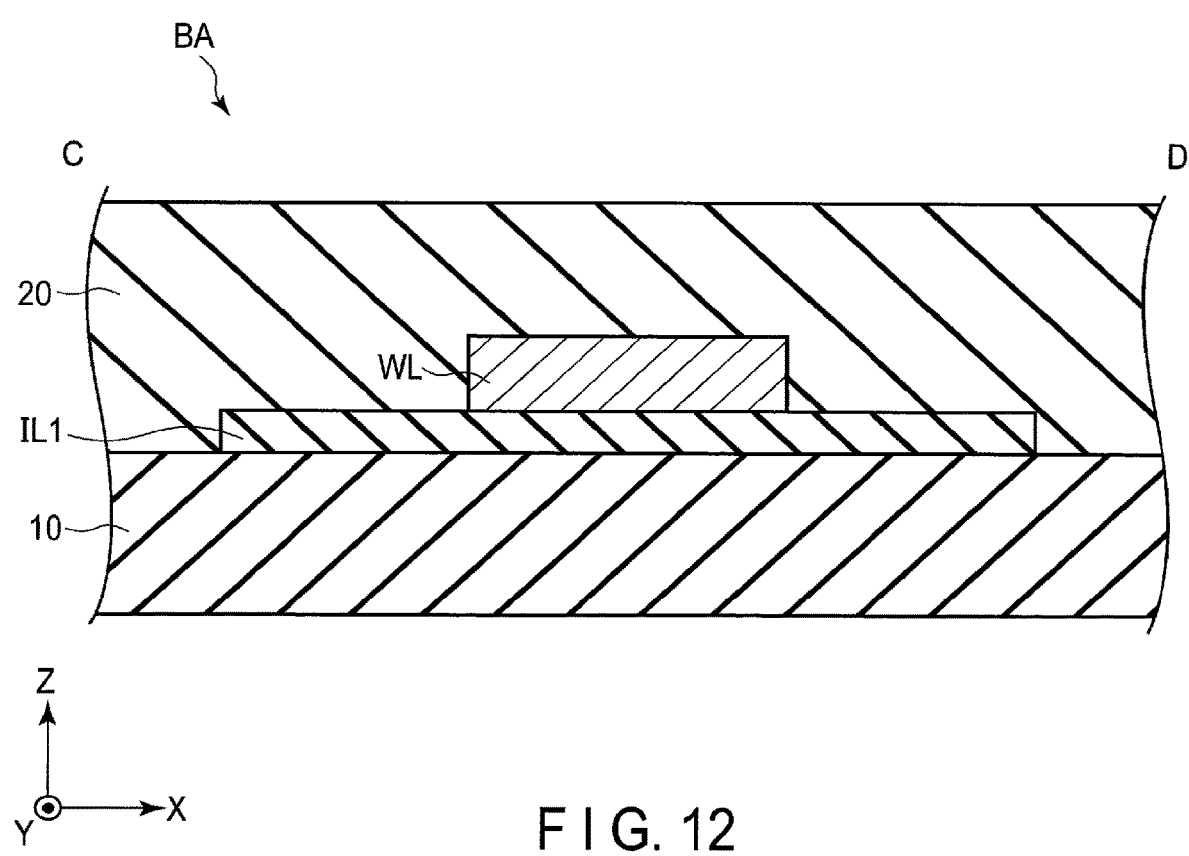
FIG. 12 is a sectional view taken along line C-D shown in FIG. 11.

FIG. 12 is a sectional view taken along line C-D shown in FIG. 11. FIG. 12 shows a plane parallel to the X-Z plane.

The inorganic insulating layer IL1 is located between the insulating substrate 10 and the wiring line WL. The inorganic insulating layer IL1 is formed of an inorganic insulating material such as silicon oxide, silicon nitride or silicon oxynitride, for example. In the example illustrated, the inorganic insulating layer IL1 contacts both the insulating substrate 10 and the wiring line WL. The resin layer 20 contacts the inorganic insulating layer IL1 on both sides of the wiring line WL. Further, the resin layer 20 contacts the insulating substrate 10 on both sides of the inorganic insulating layer IL1. That is, the inorganic insulating layer IL1 is formed in an area which substantially corresponds to the wiring line WL.

The same effect as that produced from the structural example shown in FIG. 4 can be produced from the present structural example. Further, since the inorganic insulating layer IL1 is provided between the insulating substrate 10 and the wiring line WL, contact of moisture contained in the insulating substrate 10 with the wiring line WL can be prevented. Therefore, corrosion of the wiring line WL can be prevented. Further, since the degree of contact between the insulating substrate 10 and the inorganic insulating layer IL1 and the degree of contact between the wiring line WL and the inorganic insulating layer IL1 are high, the degree of contact between the wiring line WL and the insulating substrate 10 increases, accordingly.

Further, according to the present embodiment, the inorganic insulating layer IL1 has the same shape as that of the unit U and is formed such that the angle β2 is less than the angle α2. That is, the inclination angle θ1 of the portion I2 with respect to the bend direction is greater than the inclination angle θ2 of the portion M2 with respect to the bend direction. Therefore, stress applied to the portion I2 can be reduced. Consequently, even if the inorganic insulating layer IL1 has an elastic modulus greater than that of the wiring line WL, thus being highly fragile, cracks, etc., of the inorganic insulating layer IL1, which may occur when bent can be prevented. As a result, disconnection of the wiring line WL associated with cracks of the inorganic insulating layer IL1 can be prevented. Further, according to this structure, the width WI2 of the portion I2 can be increased. That is, even if the substantive inclination angle of the portion I2 with respect to the bend direction decreases as the width WI2 increases, an increase of the stress applied to the inorganic insulating layer IL1 can be prevented by making the inclination angle 91 greater than the inclination angle θ2.

Figure 13:
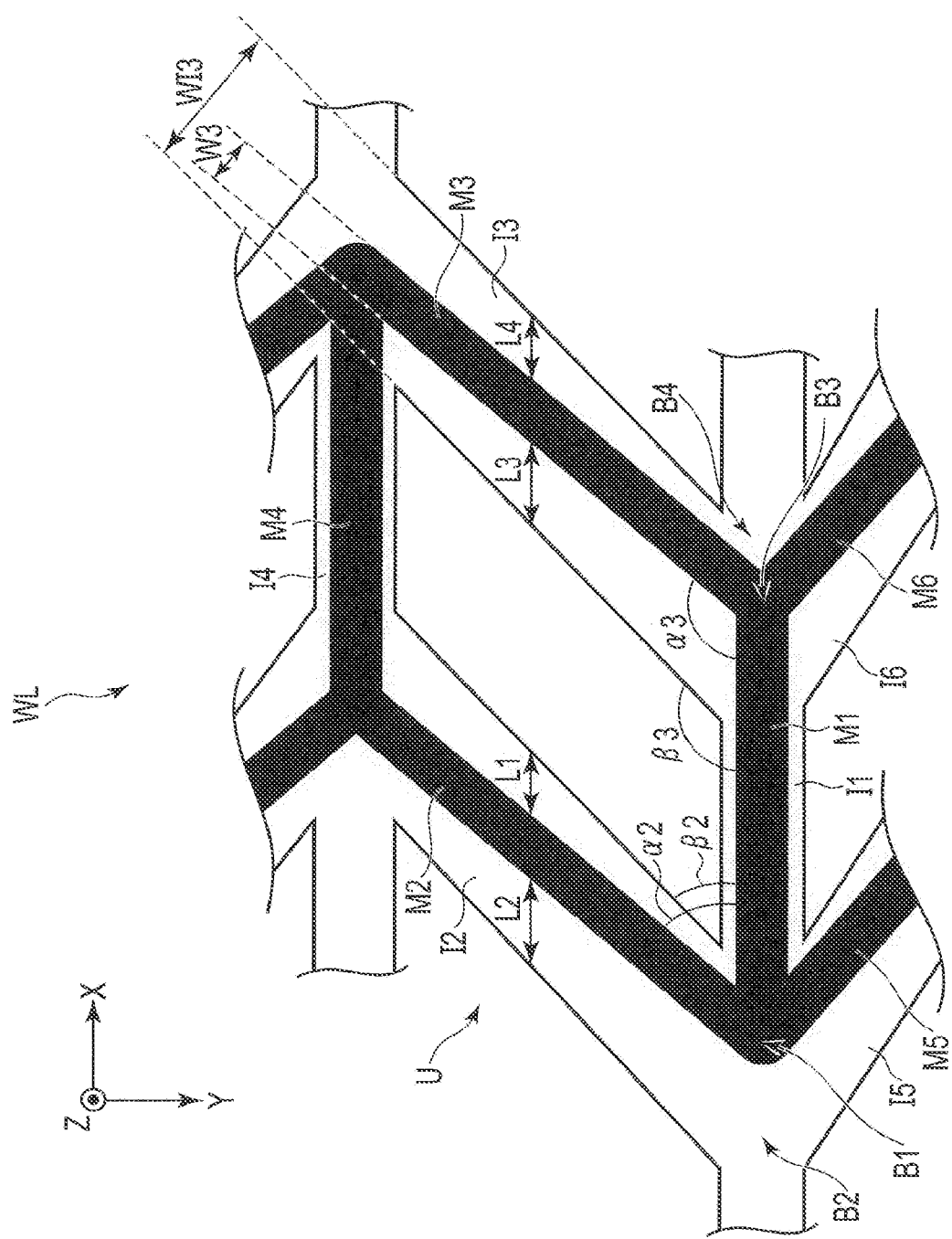
FIG. 13 is a plan view of another example of the structure of the wiring line WL.

FIG. 13 is a plan view of another example of the structure of the wiring line WL. The structural example shown in FIG. 13 differs from the structural example shown in FIG. 11 in that the unit U is substantially a parallelogram. Since the unit U has the same structure as that shown in FIG. 8, detailed description thereof will be omitted.

The inorganic insulating layer IL1 is located directly below the wiring line WL and has substantially the same shape as that of the wiring line WL. That is, the inorganic insulating layer IL1 has the portion I4 overlapping the portion M4 in addition to the portions I1, I2 and I3. The portion I4 extends parallel to the portion I1, that is, the first direction X and connects the portion I2 and the portion I3. The portion M4 entirely overlaps the portion I4. The portion M4 is located substantially at the center of the portion I4 in the second direction Y. In the example illustrated, the portion I4 also extends in an area in which the portion M4 is not provided.

The portion I3 extends parallel to the portion I2. That is, the angle β3 is an obtuse angle in the present structural example. The angle β3 is greater than the angle α3. In other words, the portion I3 is more inclined with respect to the bend direction than the portion M3. Further, the relationship between the distance L3 and the distance L4 is the same as the relationship between the distance L2 and the distance L1. That is, the distance L3 on the portion M4 side is less than the distance L3 on the portion M1 side. The distance L4 on the portion M4 side is greater than the distance L4 on the portion M1 side. The width WI3 of the portion I3 is greater than the width W3 of the portion M3.

Further, the present structural example can be regarded such that the bend portions B1 and B3 provided in the wiring line WL and the bend portions B2 and B4 provided in the inorganic insulating layer IL1 project in the same direction. In the example illustrated, the bend portions B1, B2, B3 and B4 project in the opposite direction to the first direction X. The same effect as that produced from the structural example shown in FIG. 11 can be produced from the present structural example.

Figure 14:
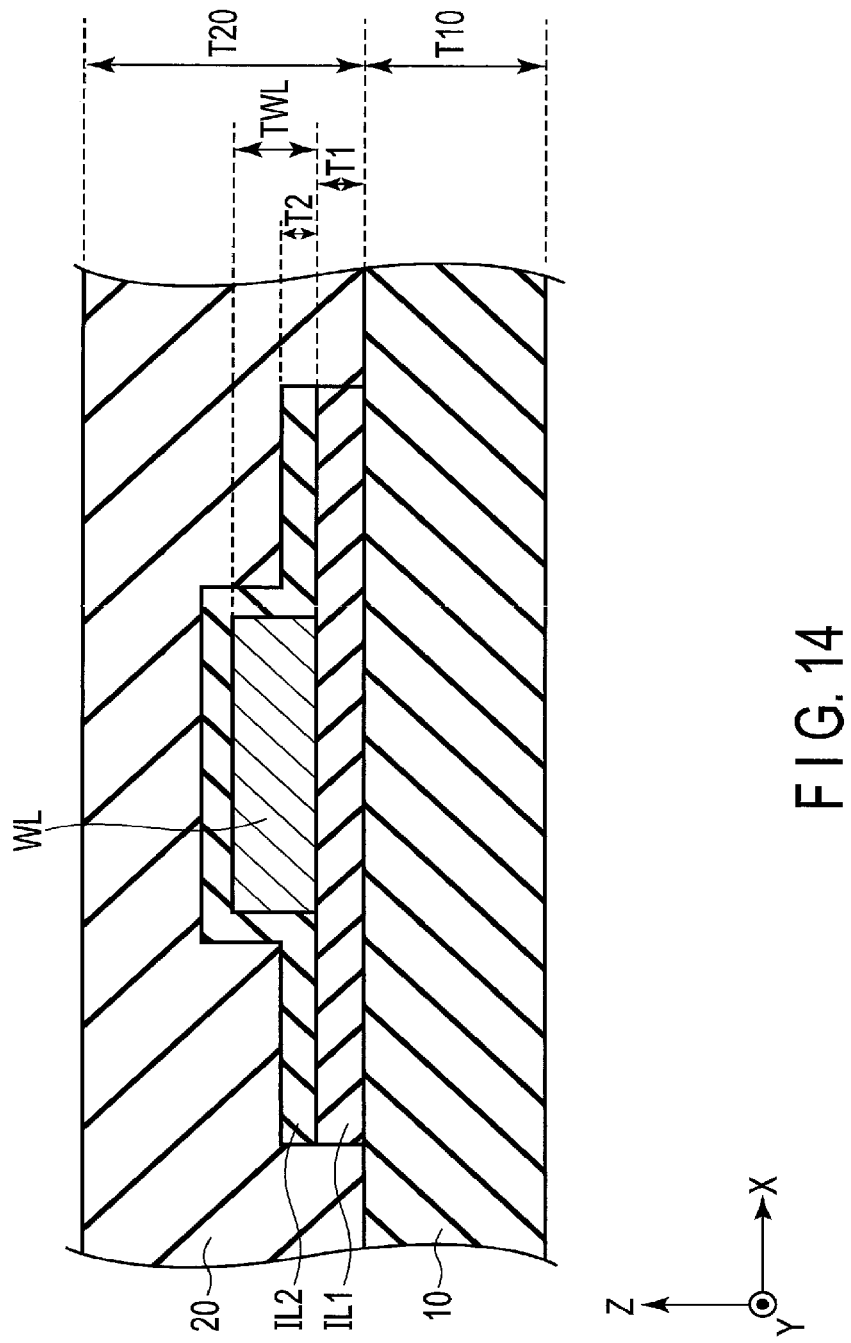
FIG. 14 is a sectional view of another example of the structure of the wiring line WL.

FIG. 14 is a sectional view of another example of the structure of the wiring line WL. The structural example shown in FIG. 14 differs from the structural example shown in FIG. 12 in that an inorganic insulating layer IL2 is provided on the wiring line WL.

The inorganic insulating layer IL2 is provided on the wiring line WL and also contacts the inorganic insulating layer IL1 on both sides of the wiring line WL. The wiring line WL contacts the inorganic insulating layers IL2 and IL1. The inorganic insulating layer IL2 has the same shape as that of the inorganic insulating layer IL1 in a planar view as shown in FIGS. 11 and 13. In the example illustrated, the width of the inorganic insulating layer IL2 is equal to the width of the inorganic insulating layer IL1. The inorganic insulating layer IL2 is formed of a different material from that of the inorganic insulating layer IL1 but may be formed of the same material as that of the inorganic insulating layer IL1. For example, the inorganic insulating layer IL1 is formed of silicon oxide, and the inorganic insulating layer IL2 is formed of silicon nitride. The resin layer 20 contacts the insulating substrate 10 on both sides of the inorganic insulating layers IL1 and IL2.

For example, a thickness T20 of the resin layer 20 is greater than a thickness T10 of the insulating substrate 10. A thickness TWL of the wiring line WL is greater than thicknesses T1 and T2 of the inorganic insulating layers IL1 and IL2. Further, the thickness T1 is greater than the thickness T2 in the example illustrated.

The same effect as that produced from the structural example shown in FIG. 12 can be produced from the present structural example. Further, since the wiring line WL1 is entirely covered with inorganic insulating materials, the wiring line WL can be more reliably protected.

Figure 15:
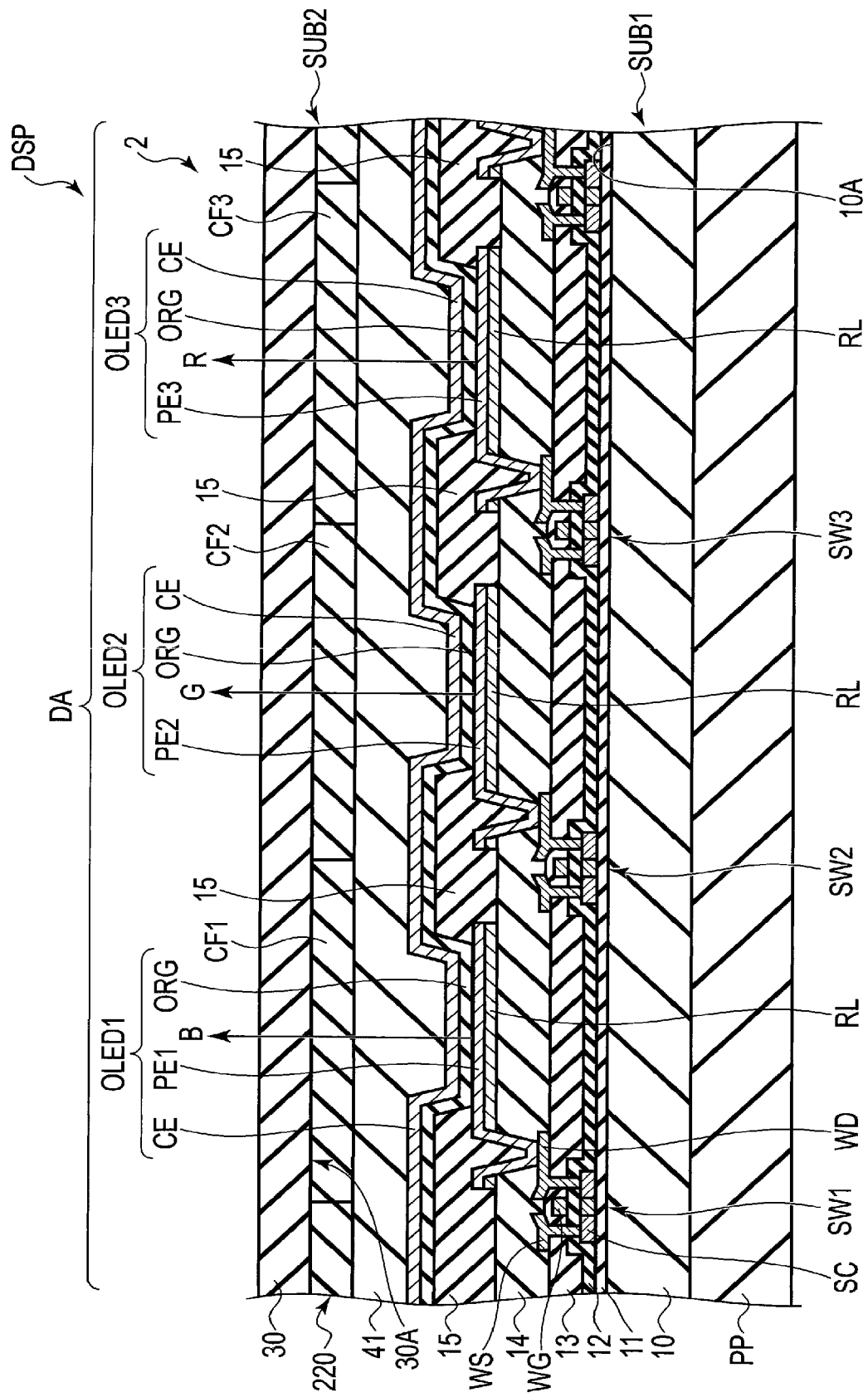
FIG. 15 is a sectional view showing an example of the structure of a display area DA shown in FIG. 1.

FIG. 15 is a sectional view showing an example of the structure of the display area DA shown in FIG. 1. The display panel 2 is composed of a first substrate SUB1 and a second substrate SUB2. In the example illustrated, the protective member PP is provided below the first substrate SUB1.

The first substrate SUB1 includes the insulating substrate 10, switching elements SW (SW1, SW2 and SW3), a reflective layer RL, organic EL elements OLED (OLED1, OLED2 and OLED3), the protective member PP, etc.

The insulating substrate 10 is formed of an organic insulating material, for example, polyimide. A first insulating layer 11 is formed on the insulating substrate 10. The first insulating layer 11 may include a barrier layer which prevents the entry of moisture, etc., from the insulating substrate 10 to the organic EL elements OLED. Note that the first insulating layer 11 may be omitted.

The switching element SW is formed on the first insulating layer 11. The switching element SW is composed of a thin-film transistor (TFT), for example. In the example illustrated, the switching element SW is a top-gate type switching element but may be a bottom-gate type switching element. As an example of the structure of the switching elements SW, the structure of the switching element SW1 will be described below.

The switching element SW1 includes a semiconductor layer SC, a gate electrode WG, a source electrode WS and a drain electrode WD.

The semiconductor layer SC is formed on the first insulating film 11 and is covered with a second insulating film 12. The gate electrode WG is formed on the second insulating layer 12 and is covered with a third insulating layer 13. The source electrode WS and the drain electrode WD are formed on the third insulating layer 13. The source electrode WS and the drain electrode WD contact the semiconductor layer SC, respectively, in contact holes which penetrate the third insulating layer 13 and the second insulating layer 12 down to the semiconductor layer SC.

The gate electrode WG is formed of a metal material such as aluminum (Al), titanium (Ti), silver (Ag), molybdenum (Mo), tungsten (W), copper (Cu) or chromium (Cr) or an alloy of these metal materials, and may have a single layer structure or a multilayer structure. The above-described metal materials can be applied to the materials of the source electrode WS and the drain electrode WD. The first to third insulating layers 11 to 13 are formed of, for example, an inorganic insulating material such as silicon oxide, silicon nitride or silicon oxynitride.

The switching element SW1 is covered with a fourth insulating layer 14. The fourth insulating layer 14 is formed of a transparent organic insulating material such as resin, for example.

The organic EL elements OLED are formed on the fourth insulating layer 14. In the example illustrated, the organic EL element OLED is the so-called top emission type organic EL element which emits light to the opposite side to the insulating substrate 10, but is not necessarily limited to this example and may be the so-called bottom emission type organic EL element which emits light to the insulating substrate 10 side. The organic EL element OLED1 is electrically connected to the switching element SW1, the organic EL element OLED2 is electrically connected to the switching element SW2, and the organic EL element OLED3 is electrically connected to the switching element SW3. The organic EL elements OLED1 to OLED3 have the same structure. As an example of the structure of the organic EL elements OLED, the structure of the organic EL element OLED1 will be described below.

The organic EL element OLED1 is composed of a pixel electrode PE1, a common electrode CE and an organic light emitting layer ORG.

The pixel electrode PE1 is provided above the fourth insulating layer 14. The pixel electrode PE1 functions as, for example, the anode of the organic EL element OLED1. The pixel electrode PE1 contacts the drain electrode WD of the switching element SW1 in a contact hole provided in the fourth insulating layer 14 and is electrically connected to the switching element SW1. The organic light emitting layer ORG is formed on the pixel electrode PE1. The organic light emitting layer ORG may further include an electron-injection layer, a hole-injection layer, an electron-transport layer, a hole-transport layer, etc., to improve light emission efficiency. The common electrode CE is formed on the organic light emitting layer ORG. The common electrode CE functions as, for example, the cathode of the organic EL element OLED1. The common electrode CE and the pixel electrode PE are formed of, for example, a transparent conductive material such as indium tin oxide (ITO) or indium zinc oxide (IZO)). The organic EL element OLED1 structured as described above emits light at luminous intensity corresponding to voltage (or current) applied between the pixel electrode PE1 and the common electrode CE.

The organic EL elements OLED are partitioned pixel PX by pixel PX with fifth insulating layer (rib) 15 formed of an organic insulating material. That is, the organic light emitting layer ORG contacts the pixel electrodes PE1, PE2 and PE3 between the fifth insulating layer 15 and the fifth insulating layer 15. Although not shown in the drawing, the organic EL element OLED should preferably be sealed with a transparent sealing film.

As shown in FIG. 15, in the case of a top emission type organic EL element, the organic EL elements OLED should preferably include the reflective layer RL between the fourth insulating layer 14 and the pixel electrodes PE1, PE2 and PE3. The reflective layer RL is formed of a highly reflective metal material such as aluminum or silver, for example. Note that a reflective surface of the reflective layer RL, that is, a surface of the reflective layer RL on the organic light emitting layer ORG side may be flat as shown in the drawing or may have recesses and projections to have light diffusion properties.

The second substrate SUB2 includes an insulating substrate 30, a color filter layer 220, etc. The insulating substrate 30 may be a glass substrate or a resin substrate, for example, or may be an optical element including an optical film, a polarizer, etc.

The color filter layer 220 is arranged on an inner surface 30A side of the insulating substrate 30. The color filter layer 220 includes a color filter CF1, a color filter CF2 and a color filter CF3. The color filters CF1, CF2 and CF3 are formed of resin materials of different colors. For example, the color filter CF1 is a blue color filter, the color filter CF2 is a green color filter, and the color filter CF3 is a red color filter. The color filter layer 220 may further include a white or transparent color filter. The color filters CF1, CF2 and CF3 are opposed to the organic EL elements OLED1, OLED2 and OLED3, respectively.

The first substrate SUB1 and the second substrate SUB2 are attached to each other by a transparent adhesive 41 in the display area DA. Further, the first substrate SUB1 and the second substrate SUB2 may be attached to each other by a sealant which surrounds the adhesive 41 in the non-display area NDA in addition to the adhesive 41.

In this display device, when the organic EL elements OLED1 to OLED3 emit light, radiation light thereof (white light) is emitted to the outside via the color filters CF1, CF2 and CF3, respectively. At this time, blue wavelength light of the white light from the organic EL element OLED1 is transmitted through the color filter CF1. Further, green wavelength light of the white light from the organic EL element OLED2 is transmitted through the color filter CF2. Still further, red wavelength light of the white light from the organic EL element OLED3 is transmitted through the color filter CF3. Accordingly, color display is realized. The pixel PX shown in FIG. 1 is the smallest unit of a color image and includes the organic EL element OLED1 to OLED3, for example.

The organic EL elements OLED1 and OLED3 include the same organic light emitting layer ORG in the above-described structural example, but do not necessarily include the same organic light emitting layer ORG. For example, the organic EL element OLED1 may include an organic light emitting layer which emits blue light, the organic EL element OLED2 may include an organic light emitting layer which emits green light, and the organic EL element OLED3 may include an organic light emitting layer which emits red light. In this structural example, the color filter layer 220 may be omitted.

The wiring line WL can be formed concurrently with the source electrode WS and the drain electrode WD, for example. In this case, the inorganic insulating layer IL1 may be formed of at least one of the first insulating layer 11, the second insulating layer 12 and the third insulating layer 13. Alternatively, the wiring line WL may be formed concurrently with the gate electrode WG, for example. In that case, the inorganic insulating layer IL1 may be formed of at least one of the first insulating layer 11 and the second insulating layer 12, and the inorganic insulating layer IL2 may be formed of the third insulating layer 13, for example.

In the present embodiment, the first inorganic insulating layer corresponds to the inorganic insulating layer IL1, the second inorganic insulating layer corresponds to the inorganic insulating layer IL2. The first portion corresponds to the portion M1, the second portion corresponds to the portion M2, the third portion corresponds to the portion M3, the fourth portion corresponds to the portion I2, the fifth portion corresponds to the portion I1, and the sixth portion corresponds to the portion I3. The first angle corresponds to the angle $\alpha 2$, the second angle corresponds to the angle $\beta 2$. The first width corresponds to the width W1, the second width corresponds to the width W2, the third width corresponds to the width WI2, the fourth width corresponds to the width WI1, the fifth width corresponds to the width WI3, and the sixth width corresponds to the width W3. Further, the first bend portion corresponds to the bend portion B1, the second bend portion corresponds to the bend portion B2, the third bend portion corresponds to the bend portion B3, and the fourth bend portion corresponds to the bend portion B4. The first bend angle corresponds to the bend angle $\gamma 1$, and the second bend angle corresponds to the bend angle $\gamma 2$. The first connecting portion corresponds to the portion M1, and the second connecting portion corresponds to the portion I1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   an insulating substrate having a bend area; and
   a wiring line located in the bend area, wherein
   the bend area is bent about a bend axis extending in a first direction,
   the wiring line in the bend area has a first portion which extends in the first direction and a second portion which extends in a direction intersecting the first portion and is connected to the first portion,
   a first angle formed by the first portion and the second portion is less than 90 degrees, and
   the wiring line has a third portion which is arranged with the second portion in the first direction and is connected to the first portion.

2. The display device of claim 1, wherein the third portion is connected to the second portion.

3. The display device of claim 1, wherein the third portion extends parallel to the second portion.

4. The display device of claim 1, wherein a first width of the first portion is less than a second width of the second portion.

5. The display device of claim 1, further comprising a first inorganic insulating layer located between the wiring line and the insulating substrate.

6. The display device of claim 5, wherein
   the first inorganic insulating layer has a fourth portion which overlaps the second portion, and
   a second angle formed by the first portion and the fourth portion is less than the first angle.

7. The display device of claim 6, wherein a third width of the fourth portion is greater than a second width of the second portion.

8. The display device of claim 7, wherein the first inorganic insulating layer has
   a fifth portion which overlaps the first portion, and
   a fourth width of the fifth portion is less than the third width.

9. The display device of claim 5, further comprising a second inorganic insulating layer which covers the wiring line and contacts the first inorganic insulating layer.

10. The display device of claim 1, further comprising a resin layer which covers the wiring line, wherein the resin layer contacts the insulating substrate on both sides of the wiring line.

11. The display device of claim 1, wherein the insulating substrate is formed of an organic material.

12. A display device comprising:
an insulating substrate having a bend area;
a wiring line located in the bend area; and
a first inorganic insulating layer located between the wiring line and the insulating substrate, wherein
the bend area is bent about a bend axis extending in a first direction,
the wiring line has a first bend portion which is bent at a first bend angle in the bend area,
the first inorganic insulating layer has a second bend portion which overlaps the first bend portion and is bent at a second bend angle,
the first bend angle and the second bend angle are less than 180 degrees, and
the second bend angle is less than the first bend angle.

13. The display device of claim 12, wherein
the wiring line has a third bend portion which is arranged with the first bend portion in the first direction, and a first connecting portion which connects the first bend portion and the third bend portion,
the first inorganic insulating layer has a fourth bend portion which is arranged with the second bend portion in the first direction, and a second connecting portion which connects the second bend portion and the fourth bend portion, and
the first connecting portion and the second connecting portion extend in the first direction.

* * * * *